United States Patent [19]

Shimizu

[11] Patent Number: 5,805,618
[45] Date of Patent: Sep. 8, 1998

[54] REPRODUCING APPARATUS FOR REPRODUCING VIDEO INFORMATION RECORDED TOGETHER WITH ERROR CORRECTION CODES

[75] Inventor: Tetsuya Shimizu, Yokohama, Japan

[73] Assignee: Canon Kabushiki Kaisha, Tokyo, Japan

[21] Appl. No.: 61,316

[22] Filed: May 14, 1993

[30]     Foreign Application Priority Data

May 18, 1992   [JP]   Japan ................................ 4-125035

[51] Int. Cl.⁶ .................................................. G11B 20/18
[52] U.S. Cl. ...................................................... 371/40.16
[58] Field of Search ........................ 371/41, 37.1, 37.4, 371/37.5, 40.16; 360/10.1, 53

[56]               References Cited

U.S. PATENT DOCUMENTS

| | | | |
|---|---|---|---|
| 3,496,549 | 2/1970 | Tong | 371/41 |
| 4,577,237 | 3/1986 | Collins | 371/39.1 X |
| 4,654,853 | 3/1987 | Moriyama et al. | 371/41 |
| 4,701,923 | 10/1987 | Fukasawa et al. | 371/41 |
| 4,742,519 | 5/1988 | Abe et al. | 371/38 |
| 4,750,178 | 6/1988 | Sako et al. | 371/374 |
| 5,031,181 | 7/1991 | Sako et al. | 371/41 |
| 5,051,999 | 9/1991 | Erhart et al. | 371/41 |
| 5,068,858 | 11/1991 | Blaum et al. | 371/41 |
| 5,151,904 | 9/1992 | Reiner et al. | 371/41 X |

*Primary Examiner*—Stephen M. Baker
*Attorney, Agent, or Firm*—Fitzpatrick, Cella, Harper & Scinto

[57]                ABSTRACT

A reproducing apparatus for reproducing video information recorded together with an error correction code on a recording medium. The apparatus has an error correction circuit to correct errors of the reproduced video information by the error correction code. The correcting algorithm of the error correction circuit in the slow reproducing mode is switched to an algorithm of a correcting ability higher than that of a correcting algorithm in the normal reproducing mode.

7 Claims, 9 Drawing Sheets

| SYNC | ID | VIDEO INFORMATION DATA | INNER CODE PARITY |

| | SYNC | ID | VIDEO INFORMATION DATA | INNER CODE PARITY |
|---|---|---|---|---|
| A1 | SYNC | ID | VIDEO INFORMATION DATA | INNER CODE PARITY |
| A2 | SYNC | ID | VIDEO INFORMATION DATA | INNER CODE PARITY |
| ⋮ | ⋮ | ⋮ | ⋮ | ⋮ |
| An | SYNC | ID | OUTER CODE PARITY | INNER CODE PARITY |

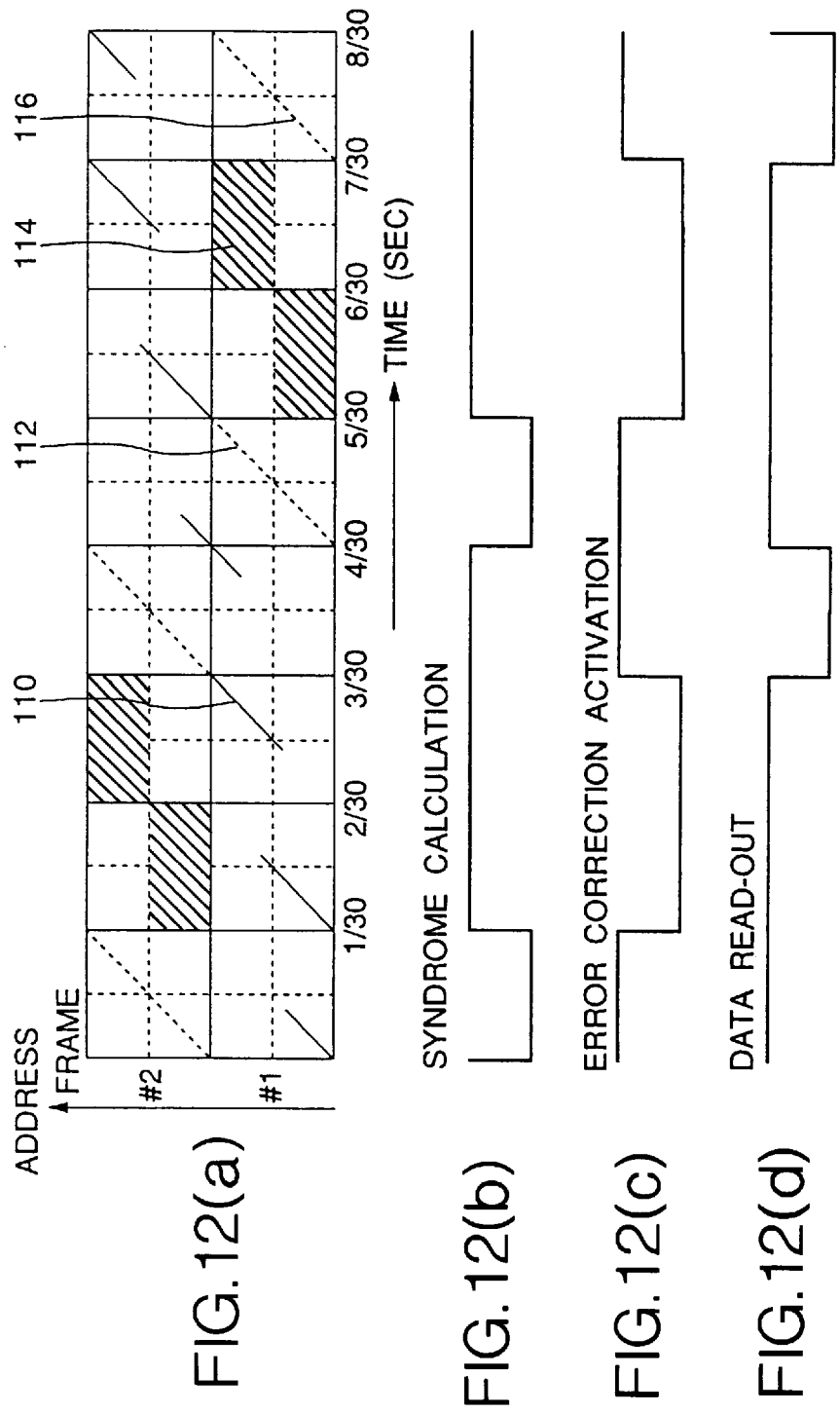

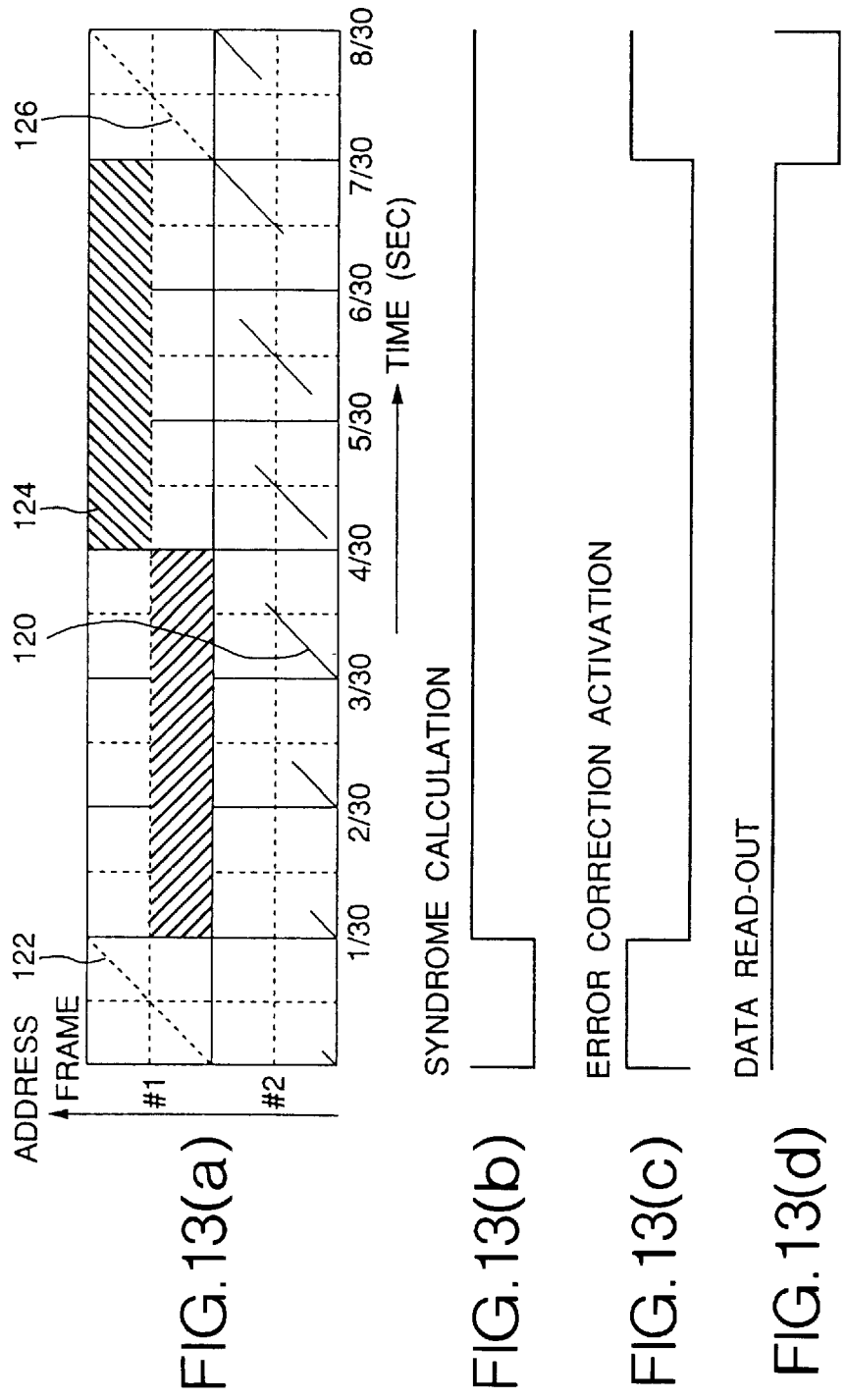

REPRODUCING APPARATUS FOR REPRODUCING VIDEO INFORMATION RECORDED TOGETHER WITH ERROR CORRECTION CODES

BACKGROUND OF THE INVENTION

1. Field of the Invention

The present invention relates to a reproducing apparatus for reproducing video information which has been error correction encoded and, more particularly, to a reproducing apparatus in a system in which video information is divided into blocks every predetermined unit number and address information and an error correction code are added to each of the blocks and the resultant blocks are recorded to a recording medium.

2. Related Background Art

As an example of such a recording system, there is what is called a digital VTR. In the digital VTR, a sync code SYNC, an address signal ID, and a parity of an error correction code (particularly, inner code) are added to video data of a predetermined unit number to be recorded, thereby forming a synchronizing block as shown in FIG. 1. A predetermined number (for example, n) of synchronizing blocks with the above structure are recorded to one track. Generally, in many cases, the error correction code is multiple product encoded. In the case where the video data of one field was double product encoded, a part of the n synchronizing blocks become the synchronizing blocks having outer code parities in place of the video data. FIG. 2 shows a structure of information which is recorded to one track. The error correcting process is executed on a unit basis of a data matrix block to which an inner code parity and an outer code parity were added.

As electromagnetic converting means, for example, as shown in FIG. 3, a rotary drum 12 having two heads 10A and 10B having different azimuth angles is used. Information shown in FIG. 2 is obliquely recorded to one track of a magnetic tape. FIG. 4 shows an example of a recording format on the tape. In FIG. 4, it is assumed that one field can be recorded by one track. $A_1, A_2, \ldots, A_n$ denote data structures shown in FIG. 2. $B_1, B_2, \ldots, B_n$ also similarly denote data structures. One track is formed by n synchronizing blocks $A_1, A_2, \ldots, A_n; B_1, B_2, \ldots, B_n$. The tracks of the synchronizing blocks $A_1, A_2, \ldots, A_n$ are recorded by the magnetic head 10A. The tracks of the synchronizing blocks $B_1, B_2, \ldots, B_n$ are recorded by the magnetic head 10B. That is, the tracks are alternately recorded by different azimuths.

Loci of the magnetic head when the video information which had been recorded as shown in FIG. 1 were reproduced at a speed of ¼ of the speed in the normal reproducing mode are shown in FIG. 5. However, an area in which 50% or more of the track is being traced by the head of the corresponding azimuth angle assumes a reproducible area. In FIG. 5, the hatched regions show the reproducible areas.

FIG. 6 is a block diagram showing a construction of a conventional reproducing apparatus. Output signals of the heads 10A and 10B are supplied to an input terminal 20 and are separated into video information data and an address signal ID by a switch 22 and a data block control circuit 24. An ID decoding circuit 26 decodes the separated address signal ID and generates a write address of a memory 28. The separated video information data is stored into the memory 28 in accordance with the write address from the ID decoding circuit 26.

In the ¼ speed reproducing mode, since the same track is traced a plurality of times as shown in FIG. 5, data is overlap-written into the memory 28. FIG. 7 shows the addressing of the writing operation into the memory 28 in the ¼ speed reproducing mode. A solid line 14 indicates a write address.

Speed magnification information, namely, information of a reproducing speed magnification is supplied to an input terminal 30. In accordance with the speed magnification information, an ECC control circuit 32 activates an error correction circuit 34. Since the error correction code has been added on a field unit basis, when the error correction is performed by the error correction circuit 34, a processing is performed on a field unit basis as shown by hatched regions 16 in FIG. 7, so that the addressing is also executed on a field unit basis. A memory control circuit 36 controls the reading operation of the memory 28 in accordance with the speed magnification information from the input terminal 30. Specifically speaking, a read address is generated at timings shown by broken lines 18 in FIG. 7. The data read out from the memory 28 is supplied from an output terminal 38 to an external circuit.

In the above conventional apparatus, as shown in FIG. 5, the reproducing head reproduces the recording data by obliquely tracing the recording track. Therefore, as compared with the normal reproducing mode, a reproduction data rate slightly changes. According to the system in which reproduction data is overlap-written into the memory, the data reproduced last remains in the memory. Consequently, there is a tendency such that the error rate deteriorates as compared with the case of the normal reproducing mode in dependence on a trace pattern.

In the conventional apparatus mentioned above, further, since the reproduction image is updated on a frame unit basis, the image updating period increases in case of the slow reproducing mode. Even when a correction processing is executed to the remaining errors, a deterioration of the image is conspicuous as compared with that in the normal reproducing mode.

To improve the above problems without changing the construction of the error correction code, there is considered a method of adaptively switching the characteristics of a reproduction equalizing circuit or the like in accordance with a slow magnification, a method of detecting the error rate of the reproduction data and selectively writing into the memory, or the like. As compared with the case of the normal reproducing mode, a circuit scale remarkably increases.

SUMMARY OF THE INVENTION

It is as object of the invention to provide a reproducing apparatus which can solve the above problems.

According to an embodiment of the present invention, there is provided a reproducing apparatus for reproducing video information recorded together with an error correction code to a recording medium, wherein the apparatus has error correcting means for correcting errors of the reproduced video information by the error correction code, and a correction algorithm in a slow reproducing mode of the error correcting means is an algorithm of a correcting ability higher than that of the correction algorithm in the normal reproducing mode.

By the above means, the correction algorithm is switched in accordance with a reproducing speed so as to finish the correction processing within a time which is permitted for the error correction processing. Consequently, the correcting ability in the slow reproducing mode can be raised without increasing a circuit scale. A reproducing apparatus of a high quality can be provided.

The above and other objects and features of the present invention will become apparent from the following detailed description and the appended claims with reference to the accompanying drawings.

BRIEF DESCRIPTION OF THE DRAWINGS

FIGS. 12(a)–12(d) are diagrams showing a memory addressing state in the ¼ speed reproducing mode of the embodiment; and FIGS. 13(a)–13(d) are diagrams showing a memory addressing state in the ⅛ speed reproducing mode of the embodiment.

DETAILED DESCRIPTION OF THE PREFERRED EMBODIMENT

An embodiment of the present invention will now be described hereinbelow with reference to the drawings.

Figure 8:
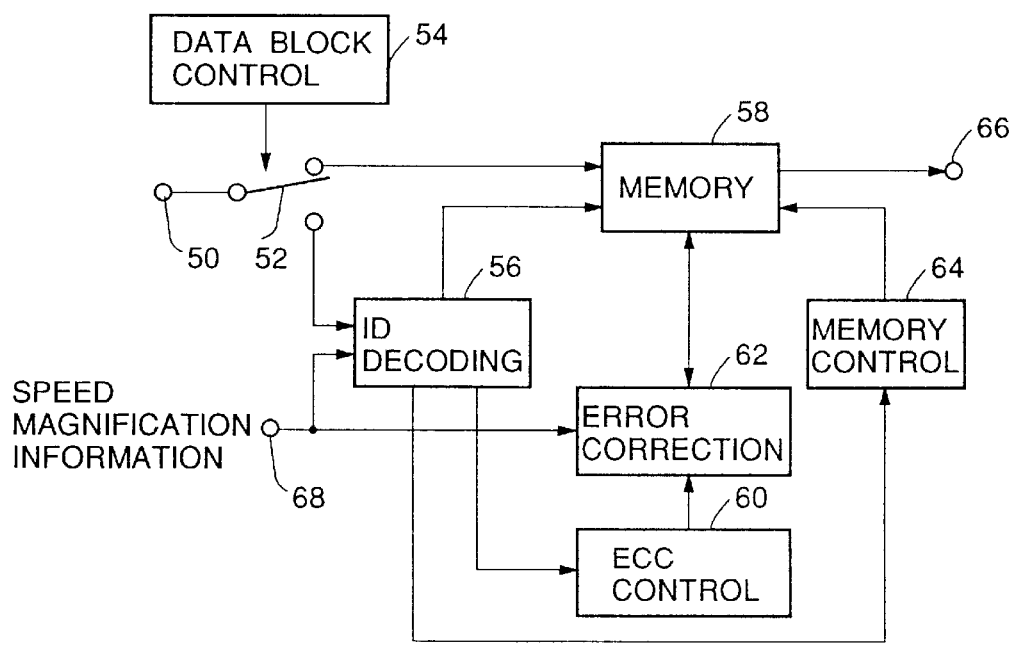
FIG. 8 is a block diagram showing a construction of an embodiment of the present invention.

FIG. 8 is a block diagram showing a construction of an embodiment of the present invention. In FIG. 8, output signals of the heads 10A and 10B are supplied to an input terminal 50 and are separated into the video information data and address signal ID by a switch 52 and a data block control circuit 54. An ID decoding circuit 56 decodes the separated address signal ID and generates a write address of a memory 58. The separated video information data is stored into the memory 58 in accordance with the write address from the ID decoding circuit 56.

In accordance with the address signal ID supplied and the speed magnification information which is supplied to an input terminal 68, the ID decoding circuit 56 generates an activation timing signal for error correction and an activation timing signal of the reading addressing operation and supplies them to an ECC control circuit 60 and a memory control circuit 64, respectively.

The ECC control circuit 60 activates an error correction circuit 62 in accordance with the activation timing signal for error correction, so that the error correction processing is executed. The memory control circuit 64 starts the reading operation of memory data in the memory 58 in response to the activation timing signal for reading out the data. The data read out from the memory 58 is sent from an output terminal 66 to an external circuit.

Figure 9:
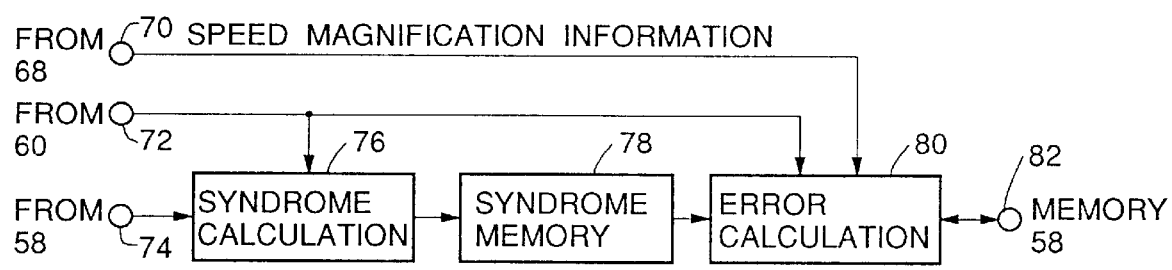
FIG. 9 is a diagram showing an example of an error correction circuit 62 in FIG. 8.

FIG. 9 shows a circuit diagram of a practical example of the error correction circuit 62. The speed magnification information from the input terminal 68 is supplied to an input terminal 70. A syndrome calculation activation timing signal and an error correction activation timing signal from the ECC control circuit 60 are supplied to an input terminal 72. The information data and parity from the memory 58 are supplied to an input terminal 74.

A syndrome calculation circuit 76 is activated by the syndrome calculation activation timing signal of the input terminal 72 and calculates a syndrome from the data supplied from the input terminal 74 and writes into a syndrome memory 78. In accordance with the speed magnification information from the input terminal 70 and the error correction activation timing signal from the input terminal 72, an error calculation circuit 80 knows the position and size of errors with reference to the syndrome memory 78, accesses to the memory 58 through a connecting terminal 82, rewrites the erroneous data and writes a flag in the case where the errors cannot be corrected.

The error calculation circuit 80 is generally constructed as a program control digital arithmetic operating circuit and can easily cope with a change or addition of the selecting conditions of a correction algorithm.

Figure 10:
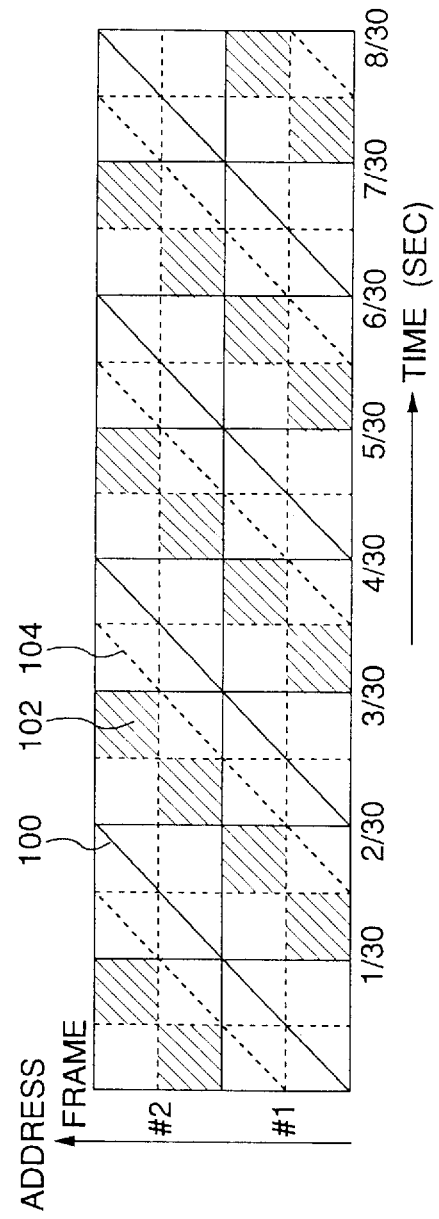
FIG. 10 is a diagram showing a memory addressing state in a normal reproducing mode according to the embodiment.

FIG. 10 shows the memory addressing operation in the normal reproducing mode. A solid line 100 indicates the writing operation of the reproduction data into the memory. In the normal reproducing mode, the syndrome is calculated simultaneously with the writing operation to the memory. Since the writing operation of the reproduction data includes jitters of the rotary drum and tape running system, in order to absorb the jitters, it is necessary to execute the error correction processing to the data in the address shown in hatched regions 102 within the times of the hatched regions 102 while providing a time interval of one field. Even when a worst error pattern is generated, a correction algorithm such that the error correction processing is finished within such a time must be selected. After completion of the error correction processing, the corrected data is read out from the memory at a timing shown by a broken line 104 and displayed on a monitor.

Figure 11:
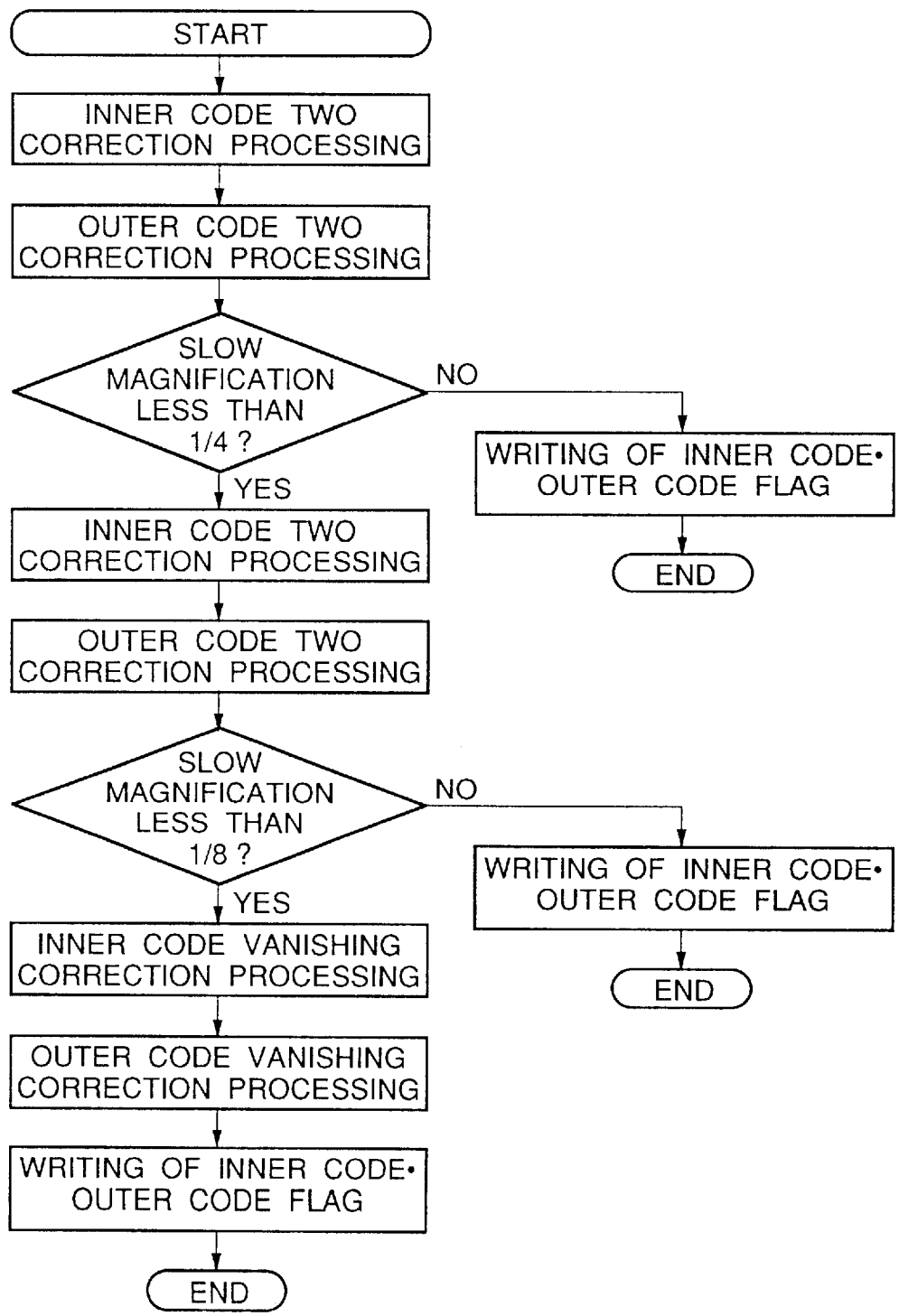
FIG. 11 is an operation flowchart for a correction processing in FIG. 8.

FIG. 11 shows a flowchart for the error correction processing. FIGS. 12(a)–12(d) show memory addressing in the ¼ speed reproducing mode. FIGS. 13(a)–13(d) show a memory addressing in the ⅛ speed reproducing mode.

Figures 1, 2, 3:
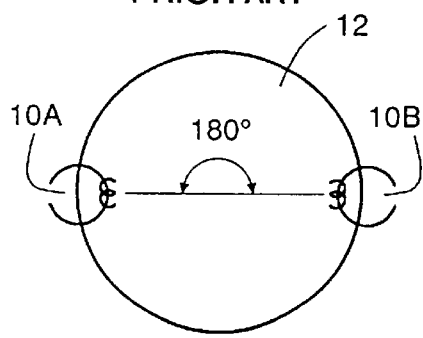
FIG. 1 is a diagram showing a format of a synchronizing block.
FIG. 2 is a diagram showing a structure of a data matrix.
FIG. 3 is a plan view of a rotary drum.
Figure 4:
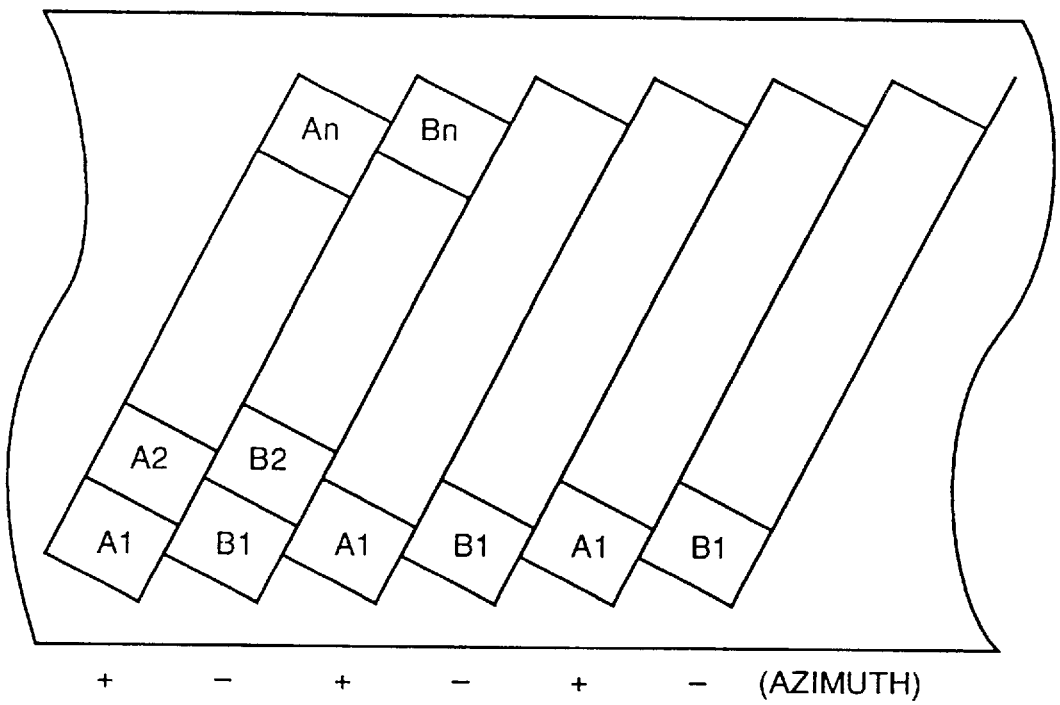
FIG. 4 is a diagram showing a recording format of a magnetic tape.
Figure 5:
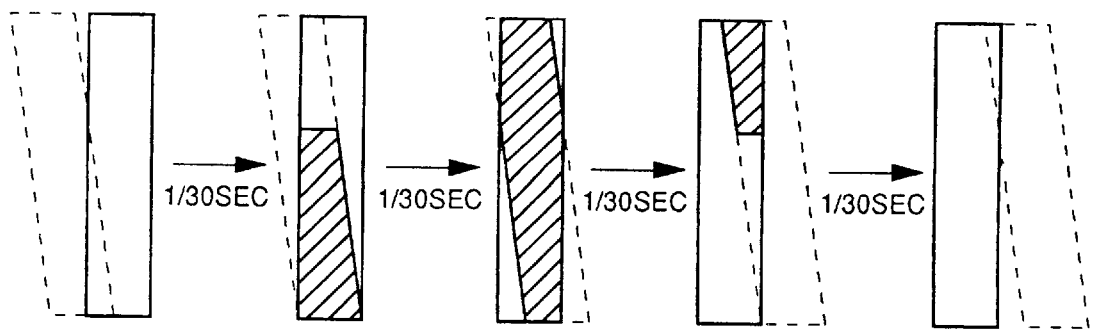
FIG. 5 is a diagram showing a changing state of a head trace in the ¼ speed reproducing mode.
Figure 6:
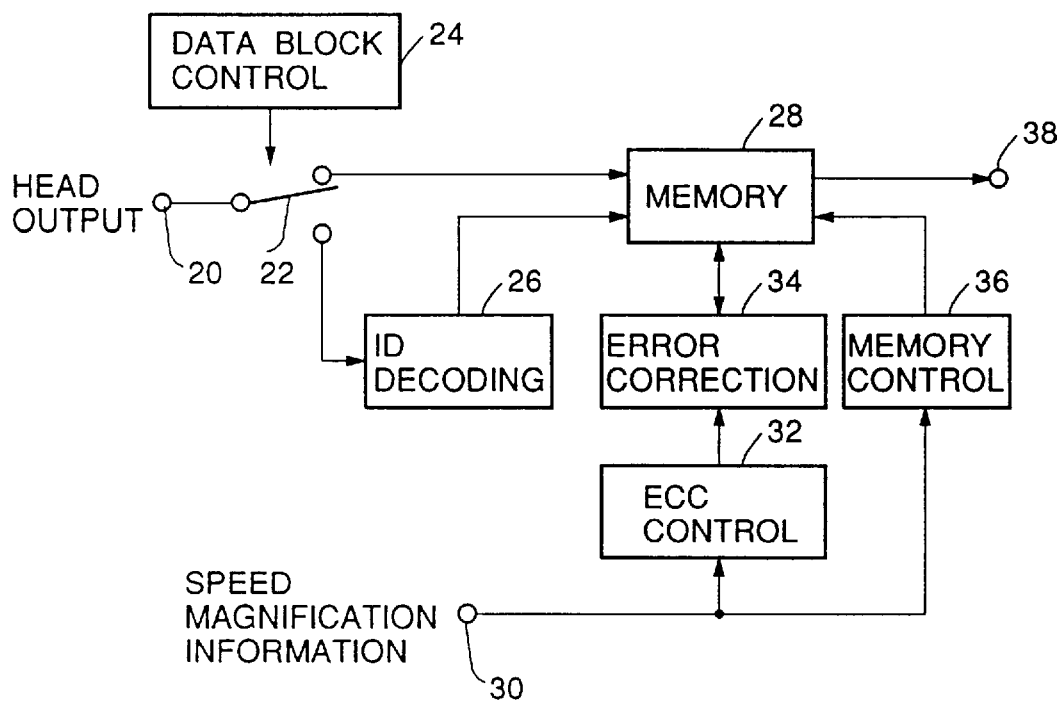
FIG. 6 is a block diagram showing a construction of a conventional apparatus.
Figure 7:
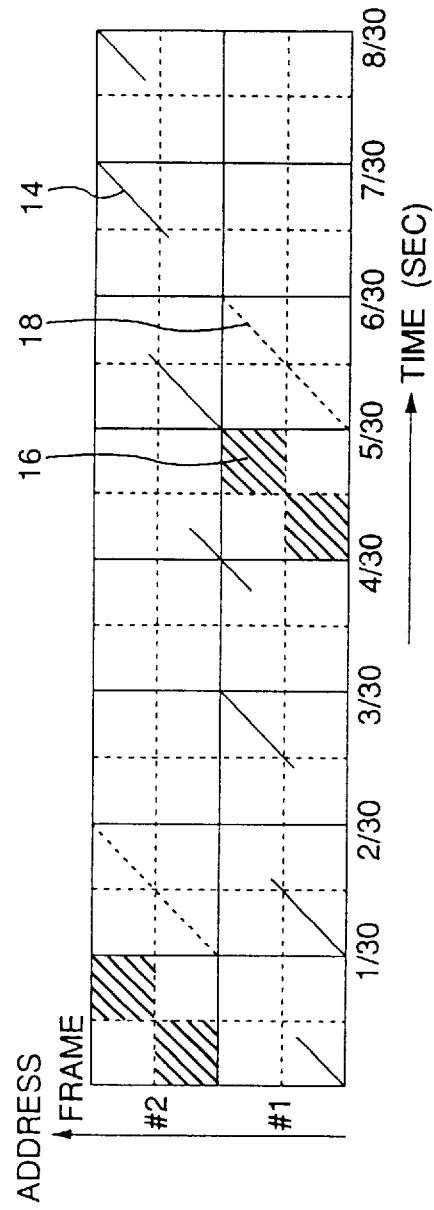
FIG. 7 is a diagram showing a memory addressing operation in the ¼ speed reproducing mode in the conventional apparatus.

In the normal reproducing mode, the decoding of the inner code and the two-correction processing are executed on a data matrix block unit basis (data of one field) shown in FIG. 2 and the data in the memory is corrected. The rewriting operation of the syndromes of the inner and outer codes regarding the corrected data is executed for the syndrome memory. After completion of the processing of the inner code of the data matrix block, the outer code is decoded and the error correction processing is similarly executed up to two-correction. The erroneous data in the memory is corrected and the syndromes of the inner and outer codes are rewritten.

After that, the speed magnification information is discriminated and the correction processing is stopped to prevent that the correction processing time lacks in case of the worst error pattern. Correction unable flags of the inner code and outer code are written into the flag area. After completion of the correction processing of one data matrix block, until the next correction activation timing signal is inputted, the correction processing is not executed.

In the ¼ speed reproducing mode, since the write addresses of data partially overlap as shown by solid lines 110 in FIG. 12(a), it takes a time which is four times as long as that in the normal reproducing mode to accumulate the data of one frame into the memory. It is sufficient to execute the error correction processing and to read out the data during such a period of time. In the slow reproducing mode, however, since the reproduction data is overlappingly reproduced, as shown by broken lines 112, it is necessary to read out the reproduction data from the memory and to calculate the syndromes. After that, the error correction processing is executed at timings shown by oblique lines 114 and the data is read out from the memory at timings shown by broken lines 116.

In the ¼ speed reproducing mode, as shown in the hatched regions 114 in FIG. 12(a), since a processing time that is permitted for the error correction processing is about twice as long as that in the normal reproducing mode, in a flowchart shown in FIG. 11, after the inner code two-correction and outer code two-correction were executed in a manner similar to the case in the normal reproducing mode, the inner code two-correction and outer code two-correction are further executed. The correction unable flags are written into the flag area in the memory by the outer code/inner code flag writing process. After the similar processes were executed to the next data matrix block, the apparatus enters a standby mode.

In the ⅛ speed reproducing mode, as shown by hatched regions 124 in FIG. 13(a), since a processing time which is allowed for the error correction processing is about six times as long as that in the normal reproducing time, in a flowchart shown in FIG. 11, the speed of the correction processing algorithm can be further raised. That is, after the two-correction processings of the inner code and outer code were repeated, the correction code data is detected on the basis of the results of the correction processings. Vanishing three-correction processings are executed for the inner code and outer code. The final correction unable flag is written into the flag in the memory.

In the embodiment, the correction algorithms have been switched on the basis of the ¼ speed reproducing mode and ⅛ speed reproducing mode as references. However, the invention is not limited to the above example.

As will be easily understood from the above description, according to the embodiment, the correcting ability in the slow reproducing mode can be raised without enlarging a circuit scale. A reproduction image of a high quality can be provided.

Although the above embodiment has been intended to raise the correcting ability in the slow reproducing mode, it is also possible to deteriorate the correcting ability in the high speed reproducing mode.

The correcting ability of the ID signal can be also set to be higher than the correcting abilities of the other signals.

Further, upon correction of the ID signal, the correcting ability can be always set to a predetermined correcting ability.

What is claimed is:

1. A reproducing apparatus for reproducing video information recorded together with error correction check codes on a recording medium, said apparatus comprising:

storage means for storing reproduced video information;

error calculation and correction means for calculating conditions of errors by using the error correction check codes and correcting errors in video information stored in said storage means according to the calculated conditions;

selection means for selecting a mode of said apparatus among a plurality of modes which include a normal reproduction mode and a slow reproduction mode; and changing means for changing an operation of said error correction means in accordance with the mode selected by said selection means, wherein a number of error calculation and correction processes executed by said error calculation and correction means in the slow reproduction mode without re-storing the same video information into said storage means is greater than that in the normal reproduction mode.

2. An apparatus according to claim 1, wherein the error correction check codes include inner parity codes and outer parity codes, and said error correction means repeatedly executes error calculation and correction processes using the inner parity codes and error calculation and correction processes using the outer parity codes.

3. An apparatus according to claim 2, wherein said error calculation and correction means executes error correction processes using one of the inner parity codes and outer parity codes a greater number of times in the slow reproduction mode than in the normal reproduction mode.

4. A reproducing apparatus for reproducing video information recorded together with error correction codes on a recording medium, said apparatus comprising:

selection means for selecting a mode of said apparatus among a plurality of modes which include a normal reproduction mode and a slow reproduction mode;

storage means for storing reproduced video information;

error calculation and correction means for calculating conditions of errors by using the error correction check codes and correcting errors in video information stored in said storage means according to the calculated conditions; and changing means for changing an error correction algorithm of said error calculation and correction means in accordance with the mode selected by said selection means, wherein the ability of an error correction algorithm which is executed in the slow reproduction mode without re-storing the same video information into said storage means is higher than that in the normal reproduction mode.

5. A reproducing apparatus for reproducing information recorded together with error correction check codes on a recording medium, said apparatus comprising:

storage means for storing reproduced information;

selection means for selecting a mode of said apparatus among a plurality of modes which include a first mode in which the recording medium is transported at a first speed and a second mode in which the recording medium is transported at a second speed faster than the first speed;

error calculation and correction means for calculating conditions of errors by using the error correction check codes and correcting errors in the information stored in said storage means according to the calculated conditions; and changing means for changing a characteristic of the error correction in accordance with the mode selected by said selection means, wherein the ability of the error correction executed in the first reproduction mode without re-storing the same information into said storage means is higher than that in the second reproduction mode.

6. A reproducing method comprising the steps of:

storing reproduced video information into a storage means;

selecting a mode of an apparatus among a plurality of modes which include a normal reproduction mode and a slow reproduction mode;

calculating conditions of errors by using error correction check codes;

correcting errors of video information stored in said storage means based on the conditions of errors calculated in the calculating step; and changing an algorithm of said calculating step and correcting errors step in accordance with a mode selected in said selecting step, wherein a number of the calculating and correcting steps executed in the slow reproduction mode without re-storing the same video information into said storage means is greater than that in the normal reproduction mode.

7. A reproducing method comprising the steps of:

storing reproduced information into storage means;

selecting a mode of an apparatus among a plurality of modes which include a first mode in which a recording medium is transported at a first speed and a second mode in which the recording medium is transported at a second speed faster than the first speed;

calculating conditions of errors of reproduced information using error correction check codes;

correcting errors in the information stored in said storage means based on the conditions of errors calculated in said calculating step;

changing an ability of the error correction regarding said calculating and correcting steps in accordance with a mode selected in said selecting step, wherein the ability of the error correction executed in the first reproduction mode without re-storing the same information into said storage means is higher than that in the second reproduction mode.

* * * * *